United States Patent [19]

Tonooka

[11] Patent Number: 4,902,235
[45] Date of Patent: Feb. 20, 1990

[54] SOCKET, CONNECTION SYSTEM AND METHOD OF MAKING

[75] Inventor: Takashi Tonooka, Shizuoka, Japan

[73] Assignee: Texas Instruments Incorporated, Dallas, Tex.

[21] Appl. No.: 221,709

[22] Filed: Jul. 20, 1988

[30] Foreign Application Priority Data

Jul. 31, 1987 [JP] Japan .............................. 62-193091

[51] Int. Cl.⁴ .......................... H01R 9/09; H05K 1/00
[52] U.S. Cl. ........................................ 439/72; 439/73; 439/82; 439/525; 439/526; 439/931; 439/876; 439/83; 29/876
[58] Field of Search ................... 439/72, 76, 81–83, 439/525, 526, 844, 876, 884–886, 890, 912, 931; 29/840, 876, 878, 879, 883, 885, 860

[56] References Cited

U.S. PATENT DOCUMENTS

| 3,346,775 | 10/1967 | Christiansen | 361/393 |
| 4,083,623 | 4/1978 | Lynch | 439/83 |
| 4,257,667 | 3/1981 | Tantorno | 439/82 |
| 4,614,388 | 9/1986 | Powell | 439/82 |

FOREIGN PATENT DOCUMENTS 1200513 7/1970 United Kingdom ................ 439/931

Primary Examiner—P. Austin Bradley
Attorney, Agent, or Firm—James P. McAndrews; John A. Haug; Melvin Sharp

[57] ABSTRACT

A socket for mounting an integrated circuit unit on a printed circuit board comprises a plurality of inserts of a platable electrically insulating material each having an opening and an exterior surface portion. The inserts are mounted in rows in a support body so the openings are accessible from one side of the body and the exterior surface portions are exposed at an opposite side of the body. Electrically conductive layers are provided on the inner surfaces of the insert openings, preferably by electroless plating techniques using the body as a plating mask, to extend to the exterior surface portions of the inserts to be soldered to circuit paths on the printed circuit board at prescribed circuit locations. Contacts are disposed in the insert openings in electrical engagement with the electrically conductive layers therein for resiliently and detachably electrically engaging terminals of integrated circuit units or the like inserted into the openings.

13 Claims, 4 Drawing Sheets

SOCKET, CONNECTION SYSTEM AND METHOD OF MAKING

BACKGROUND OF THE INVENTION

The invention relates to a socket and particularly to a socket to be used in making connection to terminals of an integrated circuit.

In conventional technology, a socket for mounting and making electrical connections to terminals of an integrated circuit (IC) chip or unit has a large number of metal contacts mounted in and aligned in rows extending along both sides of an electrically insulating body. Lead legs extend from the contacts at the bottom of the body to make electrical connections to circuit paths formed on a printed circuit board or other substrate or the like, and the opposite ends of the contacts are disposed to receive and detachably, resiliently engage terminals of an IC chip inserted into the contacts at the top of the body, thereby to connect the IC terminals to the circuit paths by use of the socket. It is sometimes difficult to work with a large number of thin lead legs in the conventional sockets without injuring the thin legs and it is also troublesome to accurately position and solder a large number of the thin metal legs to printed circuit paths on the substrate. In addition, the thin lead legs are not desirable from a standpoint of strength.

BRIEF SUMMARY OF THE INVENTION

It is an object of this invention to provide a socket which does not require complicated handling of the lead legs to avoid injury thereto, to provide a socket which is easy to install at a prescribed location on a printed circuit board substrate or the like, and to provide a socket which is strong and reliable in use.

Briefly described, the socket of this invention comprises a plurality of contacts to which terminals of an IC chip or the like are easily connected in a detachable manner, and a body or support of an electrically insulating material which supports the contacts to be easily installed at a prescribed location on a printed circuit board or other substrate. Selected parts of the support are provided with electrically conductive layer portions in electrically connecting engagement with the contact parts and parts of those electrically conductive layer portions extend to exterior surfaces of the socket body which are disposed to be connected to respective portions of printed circuit paths or the like on a printed circuit board or other substrate.

DESCRIPTION OF THE DRAWINGS

Other objects, advantages and details of the socket of this invention appear in the following detailed description of preferred embodiments of the invention, the detailed description referring to the drawings in which.

DESCRIPTION OF THE PREFERRED EMBODIMENTS

Figure 10:
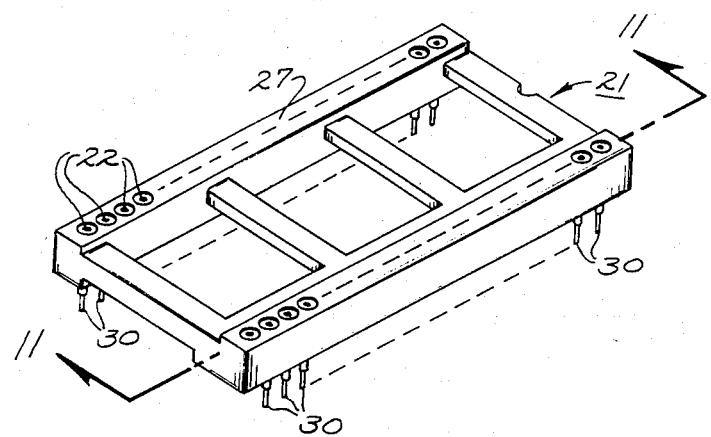
FIG. 10 is a perspective view of a conventional, prior art socket.
Figure 11:
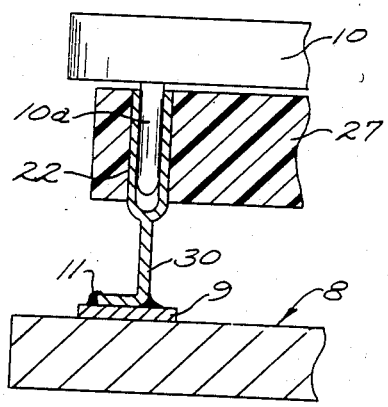
FIG. 11 is a partial section view along line 11—11 of FIG. 10 illustrating use of the conventional socket in mounting an IC device.

In the conventional socket 21 as shown in FIGS. 10 and 11, contacts 27 are mounted in and aligned in rows along both sides of an electrically insulating body 27 so that thin lead legs 30 extend from the contacts at the bottom of the body to be electrically connected by solder 11 or the like to copper foil circuit paths 9 provided on a printed circuit board or other substrate 8. In that arrangement, terminals 10a of an integrated circuit (IC) unit 10 are inserted into the contact parts 27 at the top of the socket body to be resiliently, electrically engaged by the contacts for electrically connecting the terminals to the circuit paths. The lead legs 30 are shown to be bent to be soldered to the circuit paths but it will be understood they are also typically inserted into openings in a circuit board before being soldered to the circuit paths.

In the socket 1 or connecting device of this invention as shown in FIGS. 1-5, a plurality of contacts 2 each comprise a preferably cylindrical bridge part 2a, a pair of tongue pieces 2b, 2b, which extend downwardly and inwardly from opposite sides of the contact bridge part, and preferably another pair of tongue pieces 2c, 2c, spaced around the bridge part at 90 degree orientations relative to the tongue pieces 2b, which also extend downwardly and inwardly from the bridge part. The contact parts are preferably formed of a resilient, electrically conductive metal material such as phosphor bronze or the like.

Figure 1:
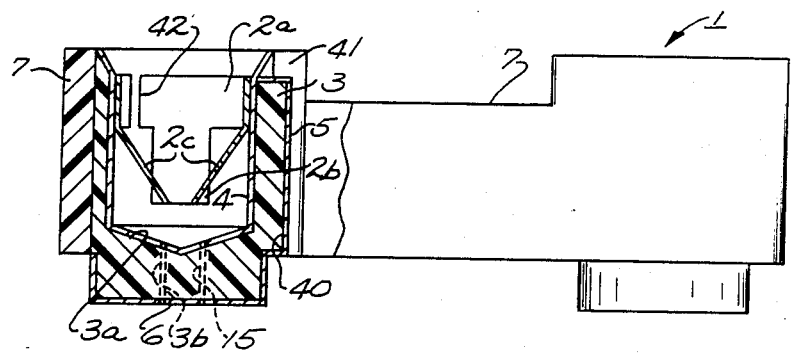
FIG. 1 is an end elevation view partially in section (along line 1—1 of FIG. 3) of a socket provided by this invention.
Figure 2:
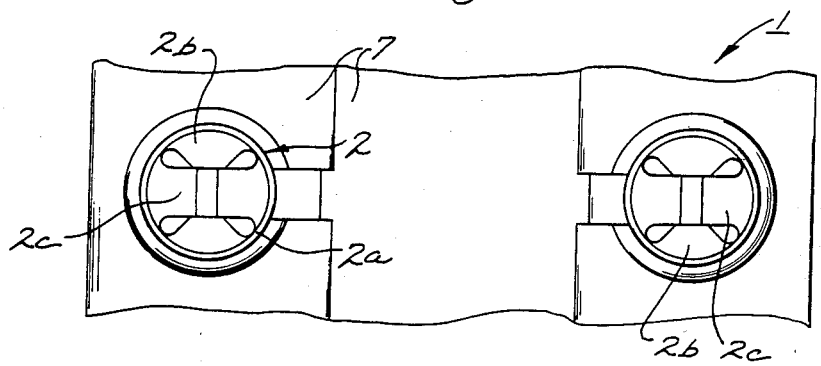
FIG. 2 is a partial plan view of the socket of FIG. 1.
Figure 3:
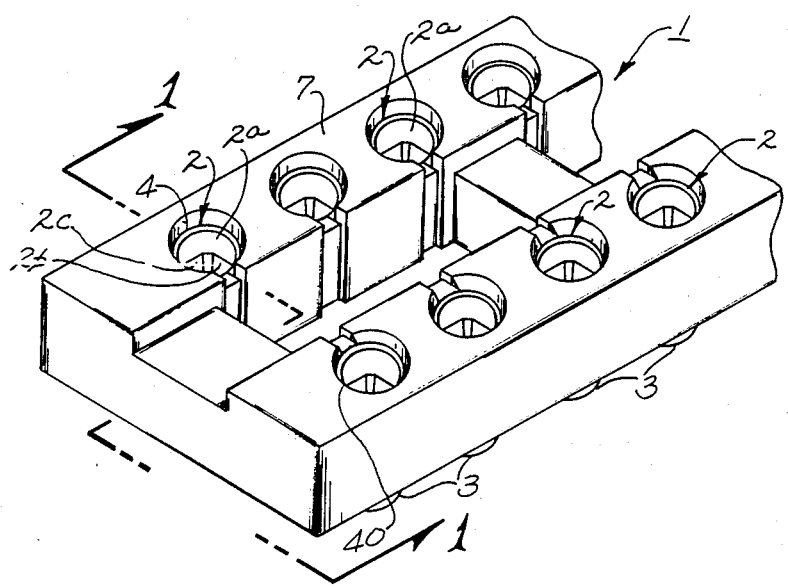
FIG. 3 is a perspective view of the socket of FIG. 1 as viewed from the upper side of the socket.
Figure 4:
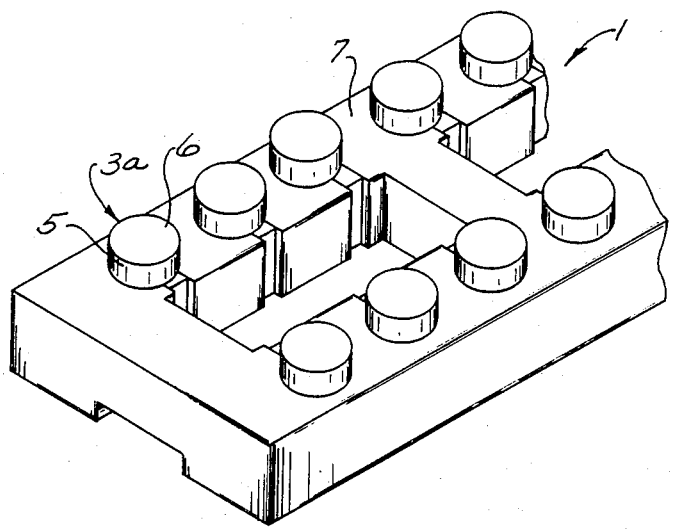
FIG. 4 is a perspective view of the socket of FIG. 1 viewed from the bottom side of the socket.

In the socket of this invention, a plurality of insert parts or members 3 are made from a platable, electrically insulating material, preferably a heat-resistant moldable plastic material such as polyether sulfone resin, a resin such as is used in forming liquid crystal display devices, or a polysenylene sulfide or the like, and an electrically conductive metal layer portion 4 of gold or the like is attached to an inner peripheral surface of a preferably blind opening 3a provided in the insert. The layer portion 4 is in turn connected with the plated layer portions 5 and 6 which are also provided on each insert part 3 at a part of the outer peripheral surface of the part 3 (preferably including a part of the top of the insert around the rim of the opening 3a) and over a lower part of the outer surface of the insert part. Preferably the plated layer portions 4, 5 and 6 of gold or the like are provided on the insert parts 3 simultaneously by any conventional non-electrolytic plating method or in any other conventional manner so that the plating layers are securely attached or adhered to the insert parts. The insert parts 3 are mounted in a pair of rows or the like in the support socket body 7 in such a manner as shown in FIGS. 1-5 that the lower terminal faces 6 of the insert parts 3 on the exterior surface portions of the insert parts are exposed and preferably facing downward from the bottom of the support body 7. Preferably the insert parts 3 are molded-in to be substantially integral with the support body 7 by use of any conventional molding-in process or the like at the time the support body 7 is being formed so that the insert parts are secured in openings 40 in the support material in any conventional manner as indicated in FIG. 1, the openings 40 preferably including slot portions 41 of the openings for accommodating the plated portion 5 of the insert parts 3 therein. The contact parts 2 are pressed into the blind openings 3a in the respective insert parts to make resilient electrical engagement with the plated portions 4 provided on the insert parts within the blind openings. For that purpose, the contact parts are preferably provided with splits 42 or the like and are compressed into openings 3a to be received and securely held in the openings in electrical connection to the plated portions 4.

Figure 5:
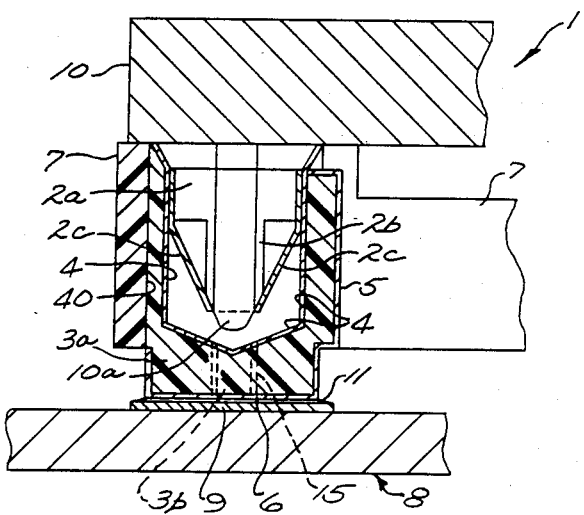
FIG. 5 is a partial cross section view similar to FIG. 1 illustrating use of the socket of FIG. 1 in mounting an IC device on a printed circuit board.

As shown in FIG. 5, the socket 1 of this invention is adapted to mount an IC chip or unit 10 and to connect terminals of the IC unit to printed circuit paths 9 on a printed circuit board 8 in an improved manner. In this regard, the same reference numerals are used in FIG. 5 as are used in FIG. 11 for components common thereto. That is, the plating 6 of gold or the like on the lower surface of each insert part 3 is placed on a prescribed or predetermined portion of a printed circuit path 9 and is soldered to that circuit path portion as indicated at 11 in FIG. 5, thereby mounting the socket 1 on the substrate to electrically connect the IC device terminals in an electrical circuit on the substrate or to another electrical component or the like. Preferably creme solder is used. In that arrangement, the lower terminal faces with plating 6 of the socket are easily positioned and soldered to the circuit paths in a strong and reliable manner. There is no likelihood of injury to the insert parts and the resulting socket mounting is strong and secure.

When a pin 10a is inserted into the contact part 2, the IC chip is connected with the socket 1. Since the pins 10a are inserted while elastically deforming the tongue pieces 2b and 2c at the time of insertion, they are accurately brought into contact thanks to the spring-like nature of the tongue pieces 2b and 2c, with the result that the electrical connection between the terminals and contacts is certain and there is no reason why the contact resistance should become large.

In the manner described above, the socket 1 is accurately installed on the printed substrate 8 and the pin 10a of the IC chip 10 and the circuit path or lead wire 9 of the printed substrate 8 are electrically and accurately connected through the tongue pieces 2b and 2c (for a total of four engagements) and through the gold-plated layers 4, 5 and 6 and the solder layer 11.

Figure 6:
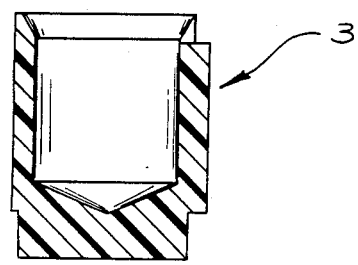
FIG. 6, 7, 8 and 9 are full or partial section views of the socket of this invention illustrating steps in manufacturing the socket.
Figure 7:
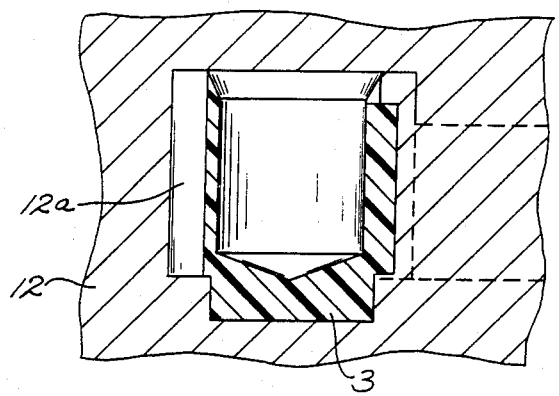

Preferably the socket 1 is made in the following manner:

First, an accommodation or insert part 3 which is shown in FIG. 6 is formed by a customary method (such as, for example, by an ejection molding method) and the accommodation part 3 is set at a prescribed location inside a mold 12 for the forming of a support part 7 as shown in FIG. 7. In the figure, 12a indicates a representative cavity in the mold for forming the support body 7 around each of the insert parts 3.

Figure 8:
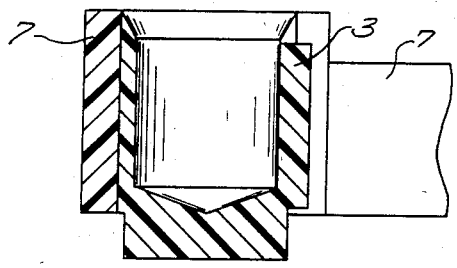

Next, the support part 7 which is shown in FIG. 8 is formed by the customary method (such as the ejection molding method). Preferably the body is formed of a corresponding electrically insulating material such as a polyether sulfone, a liquid crystal device polymer or polysenylene sulfide or the like. At this juncture, the accommodation parts 3 are fixed in the support 7 to become substantially integral with the support. In this manner, the exposed surfaces of the insert parts 3, except for the portions of those parts which are to be plated, are masked by the material of the body 7.

Figure 9:
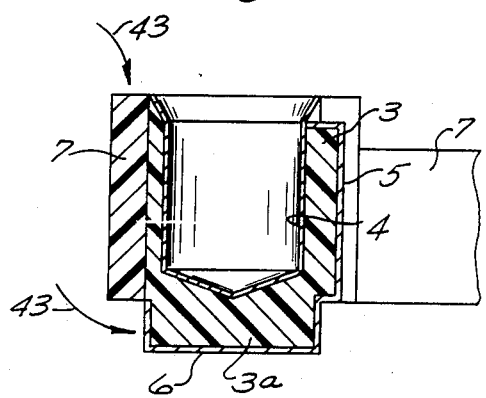

Next, the gold plated layers 4, 5 and 6 or the like which are shown in FIG. 9 are formed by an electroless plating method or the like as indicated diagrammatically in FIG. 9 by the arrows 43. For example, where the material of the insert parts 3 is activated for electroless plating or the like, the material of the body 7 is left free of such activation to serve as a mask and the body 7 with its inserts 3 therein is immersed in a plating bath to form the plated layer portions 4, 5 and 6. Finally, the contact part 2 which has been made ready on the side is compressively placed inside each insert part 3, thereby completing a socket 1 which is shown in FIGS. 1-4.

In addition to the above examples, the gold plated layers can be prepared in the following manner:

As is shown by a broken line in FIGS. 1 and 5, a through hole 3b is alternately or additionally provided at the bottom of the insert part 3, a gold plated layer indicated by a second broken line 15 is formed on the upper surface of the bottom of opening 3a and on the inner peripheral surface of the through hole 3b, thereby making it possible for the gold plated layers 4, 15 and 6 to be connected in sequence so that the tongue pieces 2b and 2c and the gold plated layer 6 on the lower surface are electrically connected. In this manner, the electrical connection distance between the tongue pieces 2b and 2c and the gold plated layer 6 on the lower surface becomes relatively smaller, with a result that the electrical resistance between them also becomes smaller.

In addition to the aforementioned examples, various modifications are possible on the basis of the technical concept of this invention. For example, insert parts 3 can be pressed into openings 40 in an ejection molded body 7 after plating of the inserts. Further, the plated layers can be formed of some other metal which is soft and electrically conductive instead of the gold plated layer. Moreover, this layer can be prepared not only by plating but also by some other methods including the pasting of a gold foil or the use of an electrically conductive paste for forming the layer.

Moreover, the shape of the tongue pieces of the contact part and the number of such tongue pieces may be suitably selected. Some other suitable materials may also be used for the accommodation or insert parts and the support parts and the electrical parts which are connected with the socket may be an electrical part other than an IC chip.

As has been explained above, an electrically conductive layer which is in contact with a contact part is provided at the support that supports the contact part in a socket according to this invention, the said electrically conductive layer being extended to the socket installation surface. Accordingly, the positioning between the socket and the prescribed location for the installation of the socket can be carried out on a plane. As a result of this, this positioning becomes easier to carry out and it also becomes easier to effect fixing for the aforementioned installation.

In addition, the plastic working (such as the bending of the lead legs) for the described installation becomes unnecessary. Moreover, its reliability is high since there is no factor that will lower the strength of the connection.

It should be understood that although particular embodiments are shown by way of example, the invention includes all modifications and equivalence of the disclosed embodiments falling within the scope of the appended claims.

I claim:

1. A connecting device for an electrical component comprising a support, and a contact of resilient electrically conductive material with which an electrical element of the component is connectable in an easily detachable manner, the support comprising a member of electrically insulating material having an electrically conductive metal layer thereon secured to the electrically insulating support material to cover two selected spaced surface portions of the support and to extend over the support between said spaced surface portions, the contact being disposed in resilient electrical engagement with the metal layer on one of said surface portions to resiliently electrically engage a component element to electrically connect the element to the metal layer, the metal layer extending to the other selected surface of the support to be electrically connected at said other support surface in an electrical circuit at the prescribed location.

2. A connecting device for an electrical component comprising a support member having an opening therein and having an exterior surface, an electrically conductive layer provided on an interior surface of the opening and extending to the exterior surface of the member, and a contact fitted within the opening in electrically conductive engagement with the electrically conductive layer to be detachably electrically connected to an electrical element inserted into the opening, the contact comprising a resilient electrically conductive material and being pressed into the opening to resiliently engage the electrically conductive layer within the opening.

3. A connecting device according to claim 2 wherein the support member has a blind opening therein open at one end and the electrically conductive layer extends from the inner surface of the opening along an exterior surface of the member to a location adjacent an opposite end of the opening.

4. A connecting device according to claim 2 wherein the support member has an opening therein extending through the member, the contact is disposed within the opening adjacent one end of the opening, and the electrically conductive layer extends from the inner surface of the opening to an exterior surface of the member at a location adjacent an opposite end of the opening.

5. A connecting device according to claim 2 wherein the contact comprises a metal member having a part resiliently engaging the electrically conductive layer and a tongue part to resiliently engage an electrical terminal inserted into the contact.

6. A socket for detachably electrically connecting terminals of an electrical component in an electrical circuit at prescribed locations comprising a support, and a plurality of contacts of resilient, electrically conductive material respectively adapted to make detachable electrical connection to such terminals, the support comprising a member of an electrically insulating material having a plurality of electrically conductive metal layer portions secured to the electrically insulating material on respective first surfaces thereof electrically engaging the respective contacts and extending from the contacts to respective other selected surfaces of the member, the contacts being disposed in resilient electrical engagement with the electrically conductive layer portions on said first surfaces to resiliently electrically engage respective component terminals to electrically connect the terminals to the respective electrically conductive layer portions, the conducting layer portions extending to be electrically connected at said respective other support surfaces in an electrical circuit at the prescribed locations.

7. A socket for detachably electrically connecting terminals of an electrical component in an electrical circuit at a prescribed location comprising a plurality of contacts respectively adapted to make detachable electrical connection to such terminals, and a support for the contacts having a member of an electrically insulating material and having a plurality of electrically conductive layer portions thereon electrically engaging the respective contacts and extending from the contacts to selected surfaces of the member to be electrically connected in an electrical circuit at the prescribed location, the support member having a plurality of openings therein and having a plurality of exterior surface portions thereon, the electrically conductive layer portions being provided on the member on respective inner surface portions of the openings and extending to said respective exterior surface portions of the member, and the contacts being fitted within the respective openings in electrically conductive engagement with the electrically conductive layer portions to be detachably electrically connected to respective component terminals inserted into the openings, the contacts comprising resiliently electrically conductive members pressed into the respective openings to resiliently engage the respective electrically conductive layer portions within the openings.

8. A socket for detachably electrically connecting terminals of an electrical component in an electrical circuit at prescribed locations comprising a plurality of contacts of resilient electrically conductive material adapted to make detachable electrical connection to each terminals, and a support comprising a plurality of insert members of an electrically insulating material each having an opening, having an exterior surface thereon, and having an electrically conductive metal layer provided on the member on an inner surface of the opening and secured to the electrically insulating support material extending to said exterior surface, the insert members being mounted in a body for disposing the insert members so the insert member openings are accessible from one side of the body and said exterior surface portions thereof are exposed at an opposite side of the body to be electrically connected in an electrical circuit at the prescribed locations, the contacts being disposed within the respective insert member openings in resilient electrically conductive engagement with the electrically conductive layers therein to be detachably electrically connected to respective component terminals inserted into the openings to electrically connect the terminals to the respective electrically conductive layers, the layers extending to the exterior surface portions of the inserts to connect the terminals in said circuit.

9. A socket according to claim 8 wherein the insert members each comprise a platable electrically insulating material and the support body masks all other surfaces of the insert members, said respective electrically conductive layers be disposed on surfaces of the insert members electrically isolated from each other by said masked surfaces of the insert members.

10. A method for making a device to connect an electrical element in an electrical circuit at a prescribed location comprising the steps of forming a support comprising an electrically insulating material having an opening therein and having an exterior surface thereon, providing an electrically conductive metal layer on an inner surface of the opening secured to the electrically insulating support material extending to said exterior surface for connection in an electrical circuit at the prescribed location, and disposing a contact of a resilient, electrically conductive material in the opening to resiliently engage the electrically conductive layer in the opening to be in electrically connected engagement to the electrically conductive layer for resiliently engaging an electrical element inserted into the opening to electrically connect the element to the electrically conductive layer.

11. A method for making a device to connect an electrical element in an electrical circuit at a prescribed location comprising the steps of forming a plurality of insert members from a platable electrically insulating material each having an opening therein and an exterior surface thereon, mounting the insert members in a body to dispose the insert member openings to be accessible from one side of the body and to dispose said exterior surfaces of the members to be accessible from an opposite side of the body and for exposing inner surface portions of the insert member openings, said exterior surfaces of the insert members, and selected portions of the insert members extending between said inner surface portions of the openings and said exterior surfaces while masking other selected portions of the insert members, plating said exposed parts of the insert members for forming electrically conductive layers thereon, and disposing contacts in the respective insert member openings in electrically connected engagement to the respective electrically conductive layers in the openings.

12. A connection system comprising a substrate having circuit paths thereon; and a socket having a plurality of inserts of electrically insulating material each having an opening and an exterior surface portion, a support body mounting the inserts so the openings are accessible from one side of the body and the exterior surface portions are disposed at an opposite side of the body, electrically conductive layer portions on inner surfaces of the insert openings extending to the respective exterior surface portions of the inserts electrically connected to the respective portions of the circuit paths on the substrate, and contacts disposed in the insert openings in electrical engagement with the electrically conductive layers therein for making detachable electrical engagement with terminals of an electrical component inserted into the openings to electrically connect the terminals in the circuit.

13. A connection system as in claim 12 wherein an integrated circuit unit has terminals thereof detachably electrically connected to the respective contacts, and the electrically conductive layers on the exterior surface portions of the inserts are soldered to said circuit path portions for mounting the socket on the substrate.

* * * * *